(12) United States Patent
Bei et al.

(10) Patent No.: US 10,580,803 B2
(45) Date of Patent: Mar. 3, 2020

(54) ARRAY SUBSTRATE AND DISPLAY PANEL

(71) Applicant: XIAMEN TIANMA MICRO-ELECTRONICS CO., LTD., Xiamen (CN)

(72) Inventors: Liangliang Bei, Xiamen (CN); Huangyao Wu, Xiamen (CN); Xuexin Lan, Xiamen (CN); Hongbo Zhou, Xiamen (CN); Yihua Zhu, Xiamen (CN); Guochang Lai, Xiamen (CN); Guozhao Chen, Xiamen (CN)

(73) Assignee: XIAMEN TIANMA MICRO-ELECTRONICS CO., LTD., Xaimen (CN)

( * ) Notice: Subject to any disclaimer, the term of this patent is extended or adjusted under 35 U.S.C. 154(b) by 0 days.

(21) Appl. No.: 16/163,586

(22) Filed: Oct. 18, 2018

(65) Prior Publication Data
US 2019/0051670 A1  Feb. 14, 2019

(30) Foreign Application Priority Data
Jun. 29, 2018 (CN) .......................... 2018 1 0715673

(51) Int. Cl.
*H01L 27/12* (2006.01)
*G09G 3/20* (2006.01)
*G09G 3/36* (2006.01)

(52) U.S. Cl.
CPC .......... *H01L 27/124* (2013.01); *G09G 3/20* (2013.01); *G09G 3/3614* (2013.01); *G09G 2300/0426* (2013.01); *G09G 2300/0452* (2013.01); *G09G 2310/0251* (2013.01); *G09G 2310/0254* (2013.01); *G09G 2310/0297* (2013.01); *G09G 2310/08* (2013.01); *G09G 2320/0209* (2013.01)

(58) Field of Classification Search
None
See application file for complete search history.

(56) References Cited

U.S. PATENT DOCUMENTS

2005/0087742 A1* 4/2005 Chang .................. G02F 1/1362
257/72
2005/0128417 A1* 6/2005 Song ................. G02F 1/134363
349/150

(Continued)

FOREIGN PATENT DOCUMENTS

CN  103257499 A  8/2013
CN  105427748 A  3/2016

*Primary Examiner* — Parul H Gupta
(74) *Attorney, Agent, or Firm* — Kilpatrick Townsend & Stockton, LLP

(57) ABSTRACT

An array substrate and a display panel are provided. The array substrate includes a non-display area and a display area. The non-display area includes a first non-display area and a second non-display area, and the display area includes a normal display area and a wiring area. The normal display area is surrounded by the first non-display area, the wiring area is surrounded by the normal display area, and the second non-display area is surrounded by the wiring area. The second non-display area comprises an opening area. In the solution, since the number of data lead lines in the same layer in the wiring area is reduced, a line distance between adjacent data lead lines is increased, thereby reducing coupling capacitance between adjacent data lead lines arranged in the same layer.

18 Claims, 12 Drawing Sheets

(56) References Cited

U.S. PATENT DOCUMENTS

| | | | |
|---|---|---|---|
| 2009/0051636 A1* | 2/2009 | Natori | G09G 3/3648 |
| | | | 345/87 |
| 2011/0050551 A1* | 3/2011 | Ota | G02F 1/134363 |
| | | | 345/87 |
| 2012/0092240 A1* | 4/2012 | Lin | G02F 1/133707 |
| | | | 345/90 |
| 2016/0118420 A1* | 4/2016 | Yang | H01L 27/1255 |
| | | | 257/40 |
| 2017/0062532 A1* | 3/2017 | Jeong | H01L 27/3246 |
| 2017/0160841 A1* | 6/2017 | Lou | G06F 3/0412 |
| 2018/0108310 A1 | 4/2018 | Dong et al. | |
| 2018/0314124 A1* | 11/2018 | Dong | G02F 1/136286 |

\* cited by examiner

ARRAY SUBSTRATE AND DISPLAY PANEL

CROSS REFERENCE TO RELATED APPLICATION

This application claims priority to Chinese Patent Application No. 201810715673.3, titled "ARRAY SUBSTRATE AND DISPLAY PANEL", filed on Jun. 29, 2018 with the State Intellectual Property Office of the People's Republic of China, which is incorporated herein by reference in its entirety.

FIELD

The present disclosure relates to the field of display technology, and particularly to an array substrate and a display panel.

BACKGROUND

With rapid development of the narrow bezel of the display screen, the full screen occurs accordingly. Since the front camera, the speaker, the indicator light, the sensor and the like are generally provided in the display screen, an opening is formed in a display area of the full screen.

Generally, the data line corresponding to the sub-pixel arranged below the opening is arranged to bypass the opening, and the area of the wiring area surrounding the opening in the full screen is limited. Therefore, a line distance between the data lines arranged in the wiring area is less than a line distance of the adjacent data lines in the display area, which results in large coupling capacitance between the adjacent data lines in the wiring area.

Therefore, it is desired for those skilled in the art to provide an array substrate and a display panel, to reduce the coupling capacitance between the adjacent data lines in the wiring area.

SUMMARY

In view of this, an array substrate and a display panel are provided in the present disclosure, to reduce coupling capacitance between the adjacent data lines in the wiring area.

An array substrate is provided, which includes a substrate, multiple gate lines and multiple sub-data lines, and m data lines and n clock signal lines.

The substrate includes a non-display area and a display area. The non-display area includes a first non-display area and a second non-display area, and the display area includes a normal display area and a wiring area. The normal display area is surrounded by the first non-display area, the wiring area is surrounded by the normal display area, and the second non-display area is surrounded by the wiring area. The second non-display area includes an opening area.

The multiple gate lines and the multiple sub-data lines are arranged in the display to area. The multiple gate lines intersect with the multiple sub-data lines to define multiple sub-pixels. The sub-pixels arranged in the same column are electrically connected to a same sub-data line.

The m data lines and the n clock signal lines are arranged in the first non-display area. Each of the m data lines corresponds to n sub-data lines of the sub-data lines, and the n sub-data lines corresponding to the same data line have a one-to-one correspondence with n charging switches. The n clock signal lines respectively control the n charging switches to be turned on, to transmit data signals in the data lines to the sub-data lines corresponding to the data lines, where m is a positive integer, and n is a positive integer greater than or equal to 2.

The sub-data line passing through the wiring area includes a first sub-data line, a second sub-data line and a data lead line. The first sub-data line and the second sub-data line are arranged in the display area, the data lead line is arranged in the wiring area. For the same sub-data line, the first sub-data line and the second sub-data line are connected by the data lead line.

In the wiring area, among the data lead lines included in the multiple sub-data lines corresponding to the same clock signal line, at least two data lead lines have at least partially overlapping orthographic projections on the array substrate.

A display panel includes the array substrate described above.

An array substrate is provided in the present disclosure, which includes a substrate, multiple gate lines and multiple sub-data lines, and m data lines and n clock signal lines. The substrate includes a non-display area and a display area. The non-display area includes a first non-display area and a second non-display area, and the display area includes a normal display area and a wiring area. The normal display area is surrounded by the first non-display area, the wiring area is surrounded by the normal display area, and the second non-display area is surrounded by the wiring area. The second non-display area includes an opening area. The multiple gate lines and the multiple sub-data lines are arranged in the display area. The multiple gate lines intersect with the multiple sub-data lines to define multiple sub-pixels, and the sub-pixels arranged in the same column are electrically connected to the same sub-data line. The m data lines and the n clock signal lines are arranged in the first non-display area. Each of the data lines corresponds to n sub-data lines, and the n sub-data lines corresponding to the same data line have a one-to-one correspondence with n charging switches. The n clock signal lines respectively control the n charging switches to be turned on, to transmit data signals in the data lines to the sub-data lines corresponding to the data lines. The sub-data line passing through the wiring area includes a first sub-data line, a second sub-data line and a data lead line. The first sub-data line and the second sub-data line are arranged in the display area, and the data lead line is arranged in the wiring area. For the same sub-data line, the first sub-data line and the second sub-data line are connected by the data lead line. In the wiring area, among the data lead lines included in the multiple sub-data lines corresponding to the same clock signal line, at least two data lead lines have at least partially overlapping orthographic projections on the array substrate.

It can be seen that in the present solutions, the data lead lines corresponding to the sub-pixels charged simultaneously are arranged to overlap, to reduce the number of data lead lines arranged in the same layer in the wiring area, and to decrease the area of the wiring area, thereby realizing the design for a narrow bezel between the second non-display area and the normal display area. Moreover, since the number of data lead lines in the same layer in the wiring area is reduced, a line distance between adjacent data lead lines is increased, thereby reducing coupling capacitance between adjacent data lead lines arranged in the same layer.

In addition, since data signals are inputted in the overlapping data lead lines simultaneously, signal transition in one data lead line has little impact on a signal in another data lead line, that is, signal interference between multiple data lead lines is decreased.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
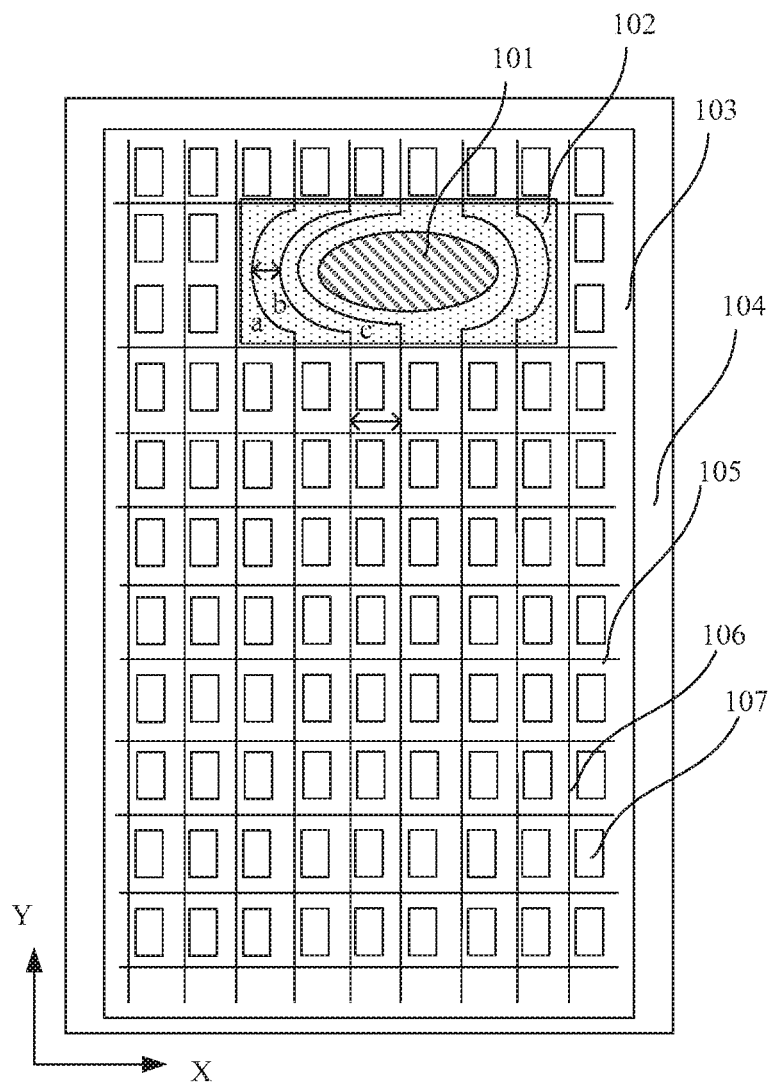
FIG. 1 is a schematic structural diagram of a full screen in the conventional technology.

Reference is made to FIG. 1, which is a schematic structural diagram of a full screen in the conventional technology. The full screen includes an opening area 101, a wiring area 102 surrounding the opening area 101, a display area 103 surrounding the wiring area 102, and a non-display area 104 surrounding the display area 103. In addition, the full screen further includes multiple gate lines 105 and multiple data lines 106 arranged in the display area 103. The multiple gate lines 105 intersect with the multiple data lines 106 to define multiple sub pixels 107 arranged as an array.

In the full screen, each of the gate lines 105 extends along a row direction X of a pixel array, and each of the data lines 106 extends along a column direction Y of the pixel array. Each of the sub pixels 107 is electrically connected to one gate line 105 and one data line 106 corresponding to the sub pixel 107. An electronic device such as a camera or a speaker may be arranged in the opening area 101.

The inventors have found that since the opening area 101 is arranged in the full screen, the data line connected to the sub-pixel arranged below the opening area 101 needs to bypass the opening area 101 to pass through the wiring area 102, as shown by a bending line a, a bending line b, and a bending line c in the wiring area 102 shown in FIG. 1. Since a distance between the opening area 101 and the display area 103 is limited, a line distance between the data lines arranged in the wiring area 102 is much smaller than a line distance between adjacent data lines in the display area 103.

It can be known in conjunction with a capacitance calculation formula $$C = \frac{\varepsilon S}{4\pi k d}$$

that the capacitance is inversely proportional to the distance in a case that other parameters remain unchanged. Therefore, coupling capacitance between adjacent data lines arranged in the wiring area is much larger than coupling capacitance between adjacent data lines arranged in the display area. Moreover, in the current design of a narrow bezel, the distance between the opening area 101 and the display area 103 becomes small, which inevitably results in a small line distance between the data lines arranged in the wiring area 102.

Since the line distance of adjacent data lines arranged in the wiring area 102 becomes small, the coupling capacitance between the adjacent data lines is large. Moreover, due to the coupling capacitance between adjacent data lines, when data signals are transmitted in adjacent data lines, crosstalk occurs between the adjacent data lines, and the data signal in the data line is abnormal, such that a voltage of the signal transmitted to the sub-pixel is different from a preset voltage value, and a problem of display unevenness of a picture occurs.

Figure 2:
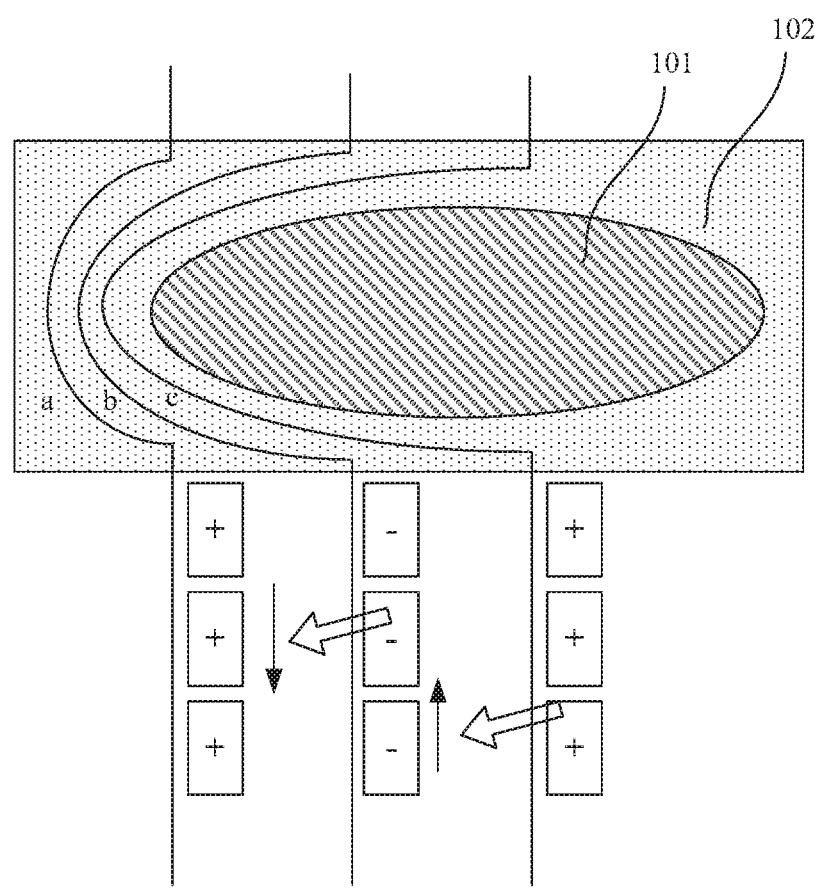
FIG. 2 is an enlarged view of a wiring area and a part of a display area shown in FIG. 1.

Reference is made to FIG. 2, which is an enlarged view of the wiring area 102 and a part of the display area shown in FIG. 1. A process of generating crosstalk between adjacent data lines arranged in the wiring area concluded by the inventors is described.

It is assumed that the sub pixels in a first column are charged by the data line a, the sub-pixels in a second column are charged by the data line b, and the sub-pixels in a third column are charged by the data line c. In a structure of the array substrate, a data signal transmitted in the data line a and a data signal transmitted in the data line c have the same polarity, which is positive polarity, and represented as a symbol "+", and a data signal transmitted in the data line b and the data signal transmitted in the data line a have opposite polarities. The polarity of the data signal transmitted in the data line b is negative, and represented as a symbol "−".

It should be noted that arrangement of the sub-pixels and the polarities of the signals received by the sub-pixels described above are only exemplary, and the array substrate according to this embodiment is not limited by the arrangement described above.

Referring to the arrangement of the sub-pixels shown in FIG. 2, in practical operation, data signals are inputted sequentially by the data lines 106 along the row direction of the pixel array, to charge the sub-pixels electrically connected to the data lines 106. In one embodiment, the gate line corresponding to the sub-pixels in a first row is charged first, so as to turn on thin film transistors connected to the gate line. In this way, the sub-pixel (arranged in the first column) with a first color is charged by the data line a, until a voltage value of the sub-pixel with the first color is equal to a preset voltage, for example, 5V. Then the sub-pixel (arranged in the second column) with a second color is charged by the data line b, and in this case, due to the coupling capacitance between the data line a and the data line b, signal transition occurs during the process of charging the sub-pixel with the second color, which reduces the voltage of the sub-pixel with the first color. Also, since a part of voltage of the sub-pixel with the second color transits to the sub-pixel with the first color, a voltage value of the sub-pixel with the second color is also less than 5V. Finally, the sub-pixel (arranged in the third column) with a third color is charged by the data line c. Similarly, due to the coupling capacitance between the data line b and the data line c, signal transition occurs during the process of charging the sub-pixel with the third color. Since polarity of a data signal received by the sub-pixel with the third color is "+", and polarity of a data signal received by the sub-pixel with the second color is "−", a voltage of the sub-pixel with the second color is increased after the signal transition of the sub-pixel with the third color. After the charging for the sub-pixels in the first row is completed, the gate line corresponding to the sub-pixels in the second row is charged, to turn on the thin film transistors connected to the gate line. In this way, the sub-pixels with the first color, the sub-pixels with the second color and the sub-pixels with the third color are sequentially charged by the data lines.

It can be seen that due to the coupling capacitance between the adjacent data lines, a charging voltage of the sub-pixel is different from a preset voltage value, which results in a phenomenon that displaying in the sub-pixel does not reach a preset display effect, for example, a color of the red sub-pixel is purplish, and a color of the green sub-pixel is yellow.

Based on this, in order to reduce the coupling capacitance between adjacent data lines in the wiring area, the adjacent data lines in the wiring area are arranged to overlap in different layers in the present disclosure, to increase a line distance between the adjacent data lines arranged in the same layer, and further reduce coupling capacitance between two adjacent data lines in the same layer.

However, the inventors have found that the adjacent data lines are arranged to overlap in a vertical direction, and crosstalk is also generated between the overlapping data lines when data signals are transmitted (a process of charging sub-pixels), which further increase the coupling capacitance between the two overlapping data lines.

Figure 3:
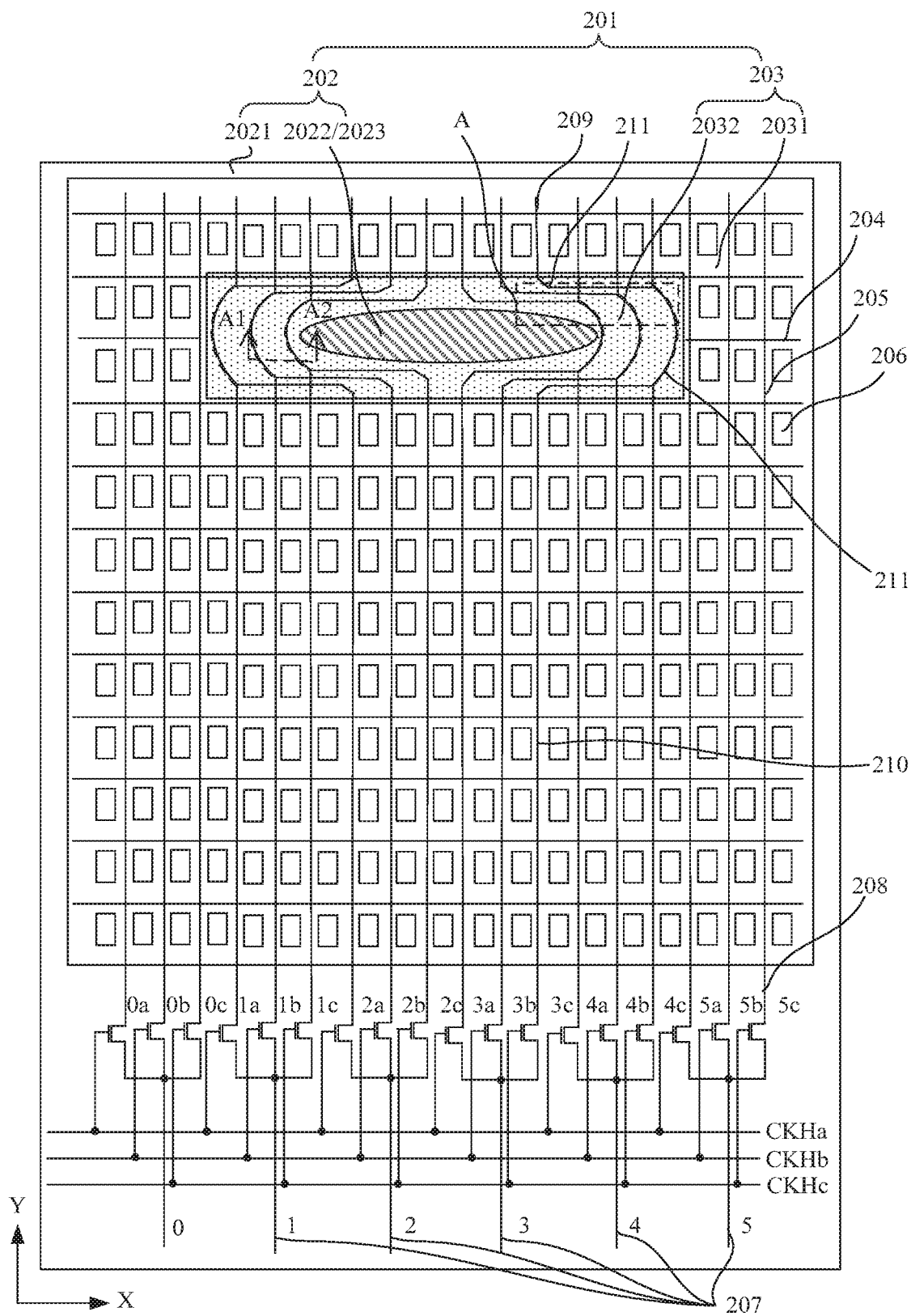
FIG. 3 is a schematic structural diagram of an array substrate according to an embodiment of the present disclosure.
Figure 4:
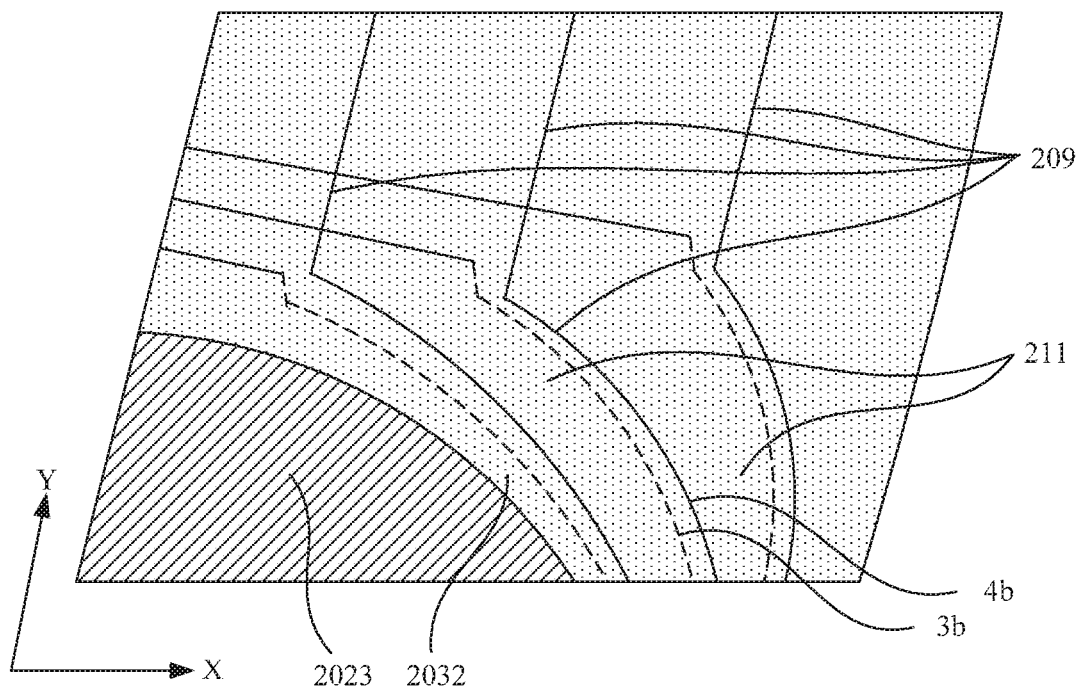
FIG. 4 is a schematic stereoscopic structural diagram of an area A shown in FIG. 3.
Figure 5:
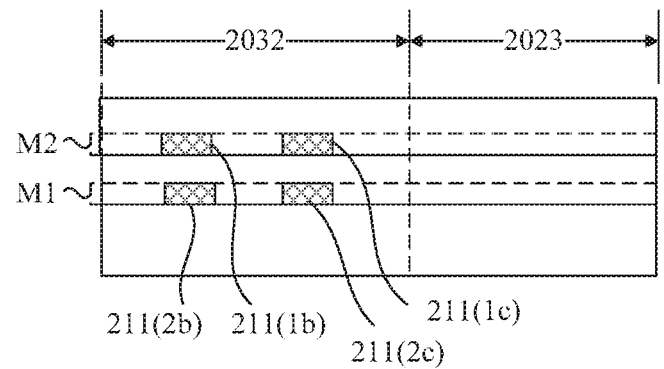
FIG. 5 is a schematic structural diagram of a cross section along A1-A2 shown in FIG. 3.

Therefore, the problem to be solved is to reduce the coupling capacitance between adjacent data lines in the wiring area while reducing the distance between the opening area and the display area. In view of this, reference is made to FIG. 3 to FIG. 5, in which, FIG. 3 is a schematic structural diagram of an array substrate according to an embodiment of the present disclosure, FIG. 4 is a schematic stereoscopic structural diagram of an area A shown in FIG. 3, and FIG. 5 is a schematic structural diagram of a cross-section along A1-A2 shown in FIG. 3. A direction of A1-A2 is parallel to an extension direction of the gate line. The array substrate according to this embodiment includes a substrate 201. The substrate 201 includes a non-display area 202 and a display area 203. The non-display area 202 includes a first non-display area 2021 and a second non-display area 2022. The display area 203 includes a normal display area 2031 and a wiring area 2032.

The normal display area 2031 is surrounded by the first non-display area 2021, the wiring area 2032 is surrounded by the normal display area 2031, and the second non-display area 2022 is surrounded by the wiring area 2032. The second non-display area 2022 includes an opening area 2023. It should be illustrated that, in this embodiment, the opening area 2023 may be a through hole formed in the second non-display area 2022 and extending through the array substrate along a thickness direction, or may be a blind hole formed by only removing a part of a predetermined film layer on the array substrate.

Moreover, multiple gate lines 204 and multiple sub-data lines 205 are arranged in the display area 203, and the multiple gate lines 204 intersect with the multiple sub-data lines 205 to define multiple sub-pixels 206. All of the sub-pixels 206 arranged in the same column are electrically connected to the same sub-data line 205.

In the first non-display area 2021, m data lines 207 and n clock signal lines (only a clock signal line CKHa, a clock signal line CKHb, and a clock signal line CKHc are shown in FIG. 3 as an example) are arranged. Each of the data lines 207 corresponds to n sub-data lines 208, and the n sub-data lines 208 corresponding to the same data line 207 have a one-to-one correspondence with n charging switches. The n clock signal lines are used to respectively control the n charging switches to be turned on, to transmit data signals in the data lines to the sub-data lines corresponding to the data lines, where m is a positive integer, and n is a positive integer greater than or equal to 2.

In FIG. 3, m=5 and n=3 are described as an example. Referring to FIG. 3, each of the data lines 207 corresponds to three sub-data lines 208. For example, a data line 1 corresponds to a sub-data line 1a, a sub-data line 1b and a sub-data line 1c. Also, for example, a data line 2 corresponds to a sub-data line 2a, a sub-data line 2b and a sub-data line 2c. The three sub-data lines corresponding to the same data lines 207 have a one-to-one correspondence with three charging switches. The three clock signal lines (a clock signal line CKHa, a clock signal line CKHb and a clock signal line CKHc) are connected with control terminals of the three charging switches respectively, to control a switch state of the charging switches.

It should be noted that m data lines may correspond to m*n sub-data lines through n clock signal lines. In FIG. 3, n is equal to 3. In practice, n may be set to other values such as 6 or 9 according to actual design requirements.

In addition, in this embodiment, the sub-data line 208 passing through the wiring area 2032 include a first sub-data line 209, a second sub-data line 210 and a data lead line 211. The first sub-data line 209 and the second sub-data line 210 are arranged in the display area 203, and the data lead line 211 is arranged in the wiring area 2032. For the same sub-data line 208, the first sub-data line 209 and the second sub-data line 210 are connected by the data lead line 211.

Referring to FIG. 3, the sub-data line passing through the wiring area 2032 includes the sub-data line 1a, the sub-data line 1b, the sub-data line 1c, the sub-data line 2a, the sub-data line 2b, the sub-data line 2c, the sub-data line 3a, the sub-data line 3b, the sub-data line 3c, the sub-data line 4a, the sub-data line 4b, and the sub-data line 4c. The sub-data lines bypass the opening area to pass through the wiring area 2032. Therefore, in this embodiment, it is defined that the sub-data line 208 passing through the wiring area 2032 is separated into three parts, that is, the part of the sub data line arranged above the wiring area 2032 is the first sub-data line 209, the part of the sub-data line arranged below the wiring area 2032 is the second sub-data line 210, and the part of the sub-data line arranged in the wiring area 2032 is the data lead line 211.

In the wiring area 2032, among the data lead lines included in the multiple sub-data lines corresponding to the same clock signal line, at least two data lead lines have at least partially overlapping orthographic projections on the array substrate.

Referring to FIG. 3, in this embodiment, there are multiple sub-data lines in the wiring area 2032 corresponding to the same clock signal line. For example, among the sub-data lines 208 passing through the wiring area 2032, the clock signal line CKHa corresponds to four sub-data lines including the sub-data line 1a, the sub-data line 2a, the sub-data line 3a and the sub-data line 4a, and the clock signal line CKHb also corresponds to four sub-data lines including the sub-data line 1 b, the sub-data line 2b, the sub-data line 3b and the sub-data line 4b, and the clock signal line CKHc also corresponds to four sub-data lines including the sub-data line 1c, the sub-data line 2c, the sub-data line 3c and the sub-data line 4c. In this embodiment, the data lead lines included in the four sub-data lines corresponding to the same clock signal line may be arranged to overlap. That is, among the sub-data line 1b, the sub-data line 2b, the sub-data line 3b and the sub-data line 4b corresponding to the clock signal line CKHb, the data lead lines included in at least two sub-data lines are arranged to overlap. For example, the data lead line included in the sub-data line 4b is arranged to overlap the data lead line included in the sub-data line 3b, as shown in FIG. 4, in which, a straight line represents that the data lead line is arranged in the plane shown in FIG. 4, and a dashed line represents that the data lead line is not arranged in the plane shown in FIG. 4.

It should be illustrated that, with reference to FIG. 5, in the embodiment, the orthographic projections of the multiple data lead lines on the array substrate partially overlap with the overlapping arrangement of the data lines. For example, in FIG. 5, the data lead line included in the sub-data line 1c and the data lead line included in the sub-data line 2c are arranged to overlap in the wiring area 2032. The orthographic projection of the data lead line included in the sub-data line 1c on the array substrate partially overlap the orthographic projection of the data lead line included in the sub-data line 2c on the array substrate.

Referring to FIG. 3, it can be known that since the overlapping data lead lines in this embodiment correspond to the same clock signal line. That is, the same clock signal controls four charging switches to be turned on, to simultaneously charge the sub-pixels connected with the four sub-data lines.

That is, the data lead lines included in the sub-data lines corresponding to the sub-pixels charged simultaneously are arranged to overlap in the solution. Since the sub-pixels are charged simultaneously with the overlapping data lead lines, signal crosstalk between the overlapping data lead lines is small.

As in FIG. 1, it is assumed that the data line a and the data line b are arranged to overlap. After completing charging for the sub-pixel with the first color in the first row by the data line a, the sub-pixel with the second color is charged by the data line b. Since no data signal is transmitted in the data line a while a data signal is transmitted in the data line b, the signal transition in the data line b is large. In the present solution, since data signals are inputted in the overlapping data lead lines simultaneously, signal transition in one data lead line has little impact on the signal in the other data lead line, that is, signal interference between the multiple data lead lines is reduced.

Moreover, since the data lead lines are arranged to overlap, the line distance between adjacent data lead lines arranged in the same layer is increased, thereby reducing coupling capacitance between adjacent data lead lines arranged in the same layer.

Figure 6:
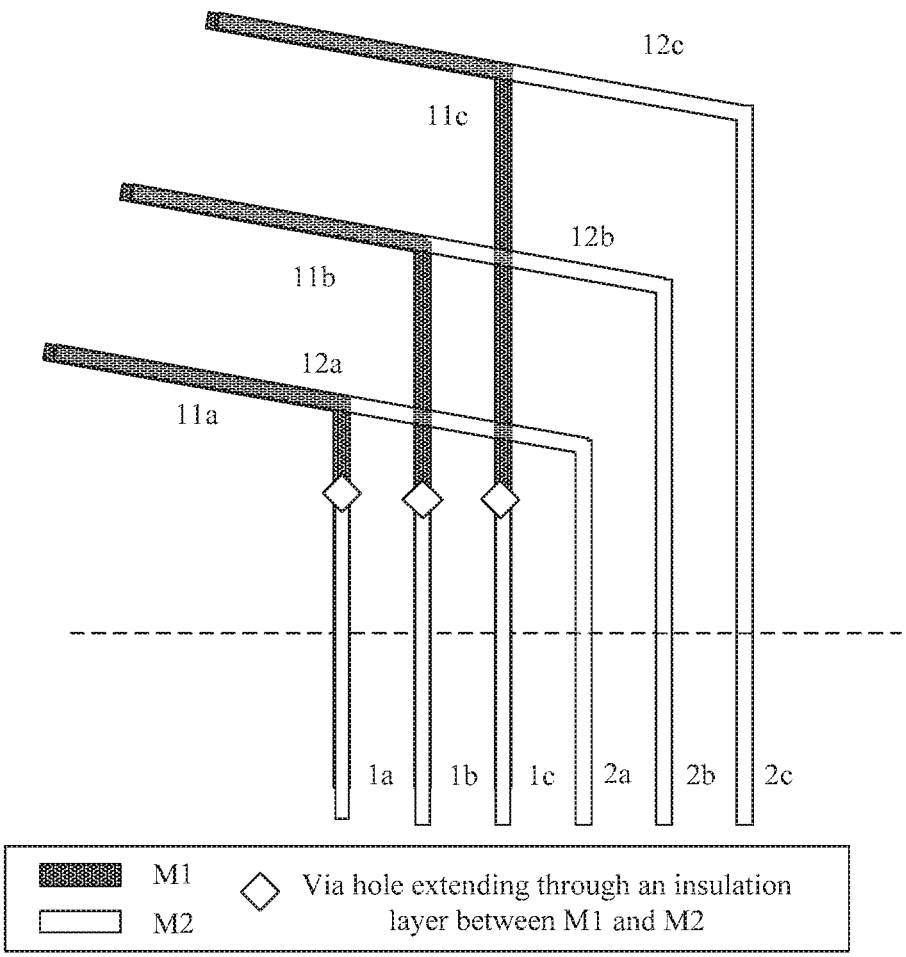
FIG. 6 is a diagram showing a laminated relation of a part of data lead lines in the wiring area shown in FIG. 3.

In addition, as shown in FIG. 6, FIG. 6 is a diagram showing a laminated relation of a part of data lead lines in the wiring area of FIG. 3. In the existing manufacturing process, the array substrate generally has a gate metal layer M1, a source metal layer M2, and a touch wiring metal layer M3. Therefore, after consideration, the data lead lines may be arranged to overlap in two layers (for example, among the two overlapping data lead lines, one data lead line is arranged in the gate metal layer M1, and the other data lead line is arranged in the source metal layer M2). Illustratively, referring to FIG. 3, the data lead line included in the sub-data line 1a is arranged to overlap the data lead line included in the sub-data line 2a. The data lead line included in the sub-data line 1a may be arranged in the gate metal layer M1, and the data lead line included in the sub-data line 2a may be arranged in the source metal layer M2. In practice, this embodiment is not limited to the case that the overlapping data lead lines are arranged in only the gate metal layer M1 and the source metal layer M2. The detailed embodiment is described below.

Referring to FIG. 3 and FIG. 6, the laminated relation of the four sub-data lines passing through the wiring area 2032 in the array substrate shown in FIG. 3 is described. At least two data lead lines of the four data lead lines corresponding to the same clock signal line are arranged to overlap. For example, the data lead line included in the sub-data line 1a may be arranged to overlap the data lead line included in the sub-data line 2a (shown in FIG. 6). In one embodiment, the data lead line included in the sub-data line 1a is arranged to overlap the data lead line included in the sub-data line 3a (not shown in FIG. 6). In one embodiment, the data lead line included in the sub-data line 1a is arranged to overlap the data lead line included in the sub-data line 4a. In one embodiment, the data lead line included in the sub-data line 2a is arranged to overlap the data lead line included in the sub-data line 3a. In one embodiment, the data lead line included in sub-data lines 2a is arranged to overlap the data lead line included in the sub-data line 4a. In one embodiment, the data lead line included in sub-data lines 3a is arranged to overlap the data lead line included in the sub-data line 4a. There are $C_4^2$ overlapping combinations.

In order to simplify wiring and avoid a crossover line problem caused by the overlapping of the data lead lines included the nonadjacent sub-data lines, the data lead lines corresponding to the adjacent sub-data lines among the four data lead lines may be arranged to overlap in this embodiment. The sub-data line 1a is adjacent to the sub-data line 2a, the to sub-data line 2a is adjacent to the sub-data line 3a, and the sub-data line 3a is adjacent to the sub-data line 4a. In the embodiment, the data lead line included in the sub-data line 1a is arranged to overlap the data lead line included in the sub-data line 2a. In one embodiment, the data lead line included in the sub-data line 2a is arranged to overlap the data lead line included in the sub-data line 3a. In one embodiment, the data lead line included in the sub-data line 3a may be arranged to overlap the data lead line included in the sub-data line 4a.

It should be noted that, this embodiment is not limited to the manner in which the data lead lines are arranged to overlap in two layers. For example, the data lead lines may be arranged to overlap in three layers or four layers, and may also be arranged to overlap in more layers according to the actual process progress.

Figure 8:
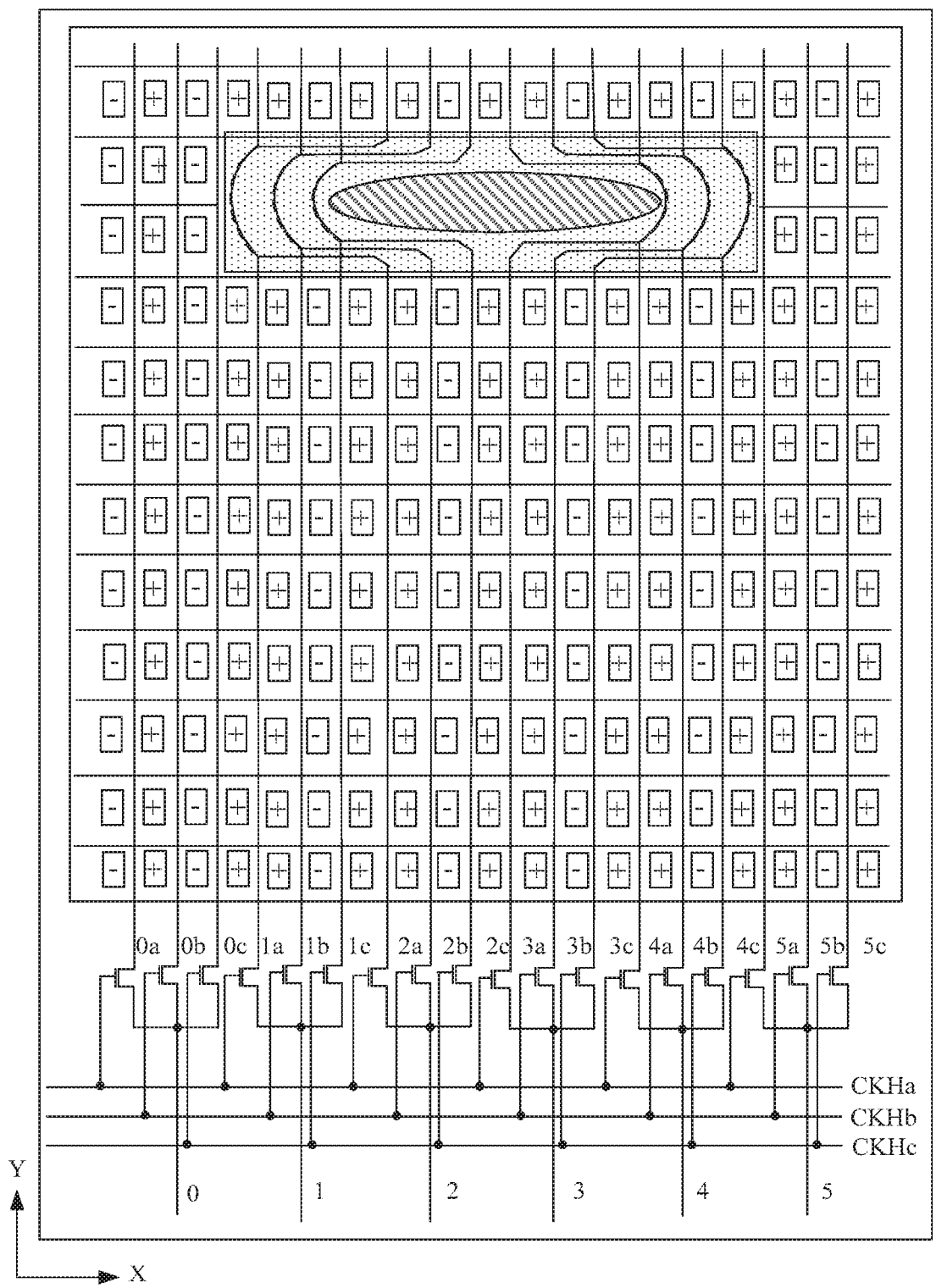
FIG. 8 is another schematic structural diagram of an array substrate according to an embodiment of the present disclosure.

Based on the above embodiment, the polarity of the data signals received in the overlapping data lead lines is further defined in the array substrate according to the embodiment. As shown in FIG. 8, which is another schematic structural diagram of an array substrate according to an embodiment of the present disclosure, in the wiring area, among the data lead lines included in the multiple sub-data lines corresponding to the same clock signal line, the data signals received in the data lead lines having the at least partially overlapping orthographic projections on the array substrate have the same polarity. For example, the data signal transmitted in the sub-data lines 1a has the same polarity as the data signal transmitted in the sub-data lines 2a in FIG. 8. For another example, the data signal transmitted in the sub-data line 1b has the same polarity as the data signal transmitted in the sub-data line 2b, and so forth.

Figure 9:
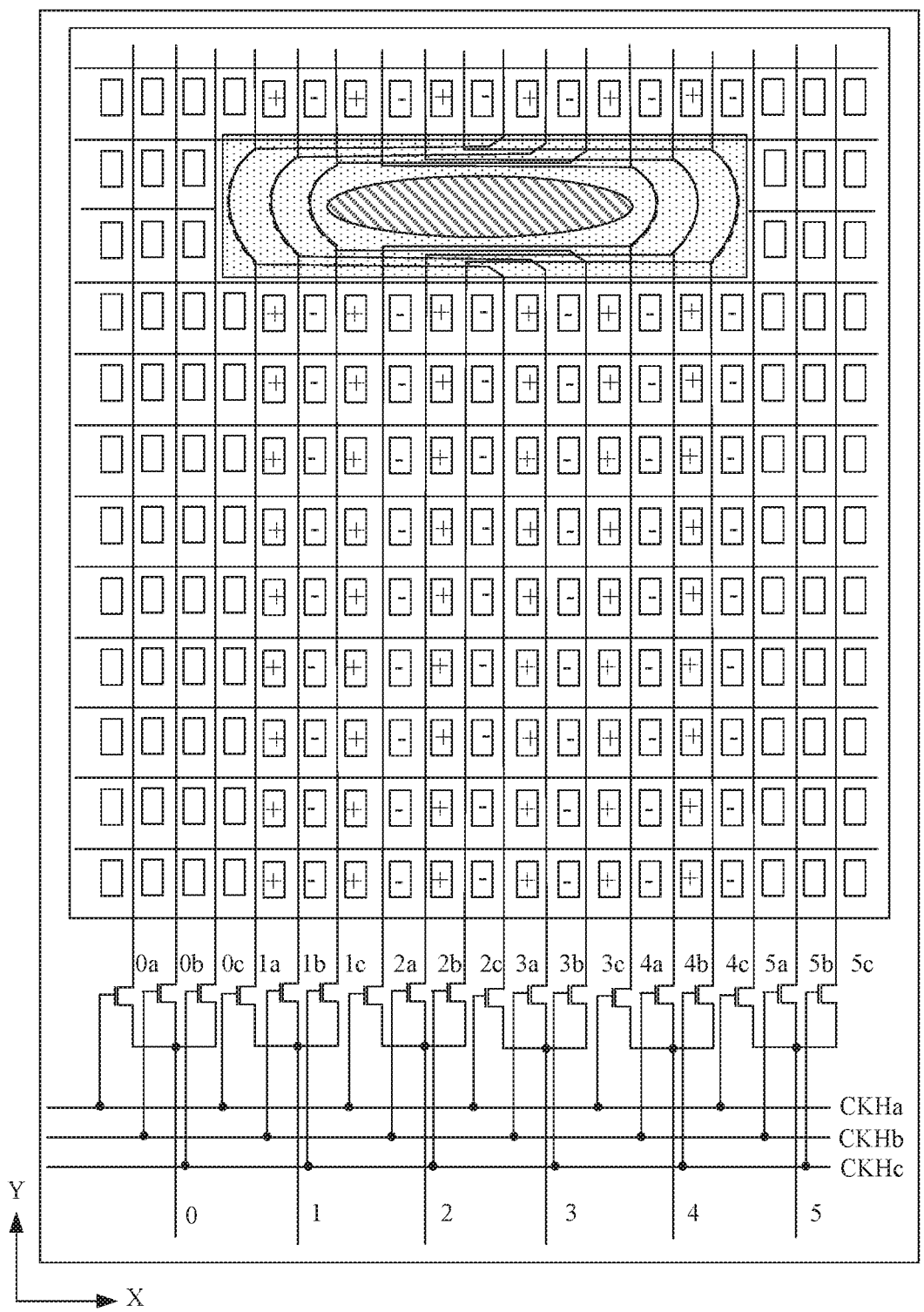
FIG. 9 is another schematic structural diagram of an array substrate according to an embodiment of the present disclosure.

Generally, the polarities of the data signals received by the sub-pixels in the display area are distributed in a certain manner. For example, the data signals in the sub-data lines corresponding to any two adjacent sub-pixels in the same row have opposite polarities. As shown in FIG. 9, which is another schematic structural diagram of an array substrate according to an embodiment of the present disclosure, it is assumed that there are 12 sub-data lines passing through the wiring area, and there are 12 sub-pixels in each row. The polarities of the data signals received by the sub-pixels in the same row may be +, −, +, −, +, −, +, −, +, −, + and − sequentially. It should be illustrated that only the polarities of the data signals received by the sub-data lines passing through the wiring area are shown in FIG. 9, and the polarities of the data signals received by the remaining sub-pixels are not shown in FIG. 9.

Figure 10:
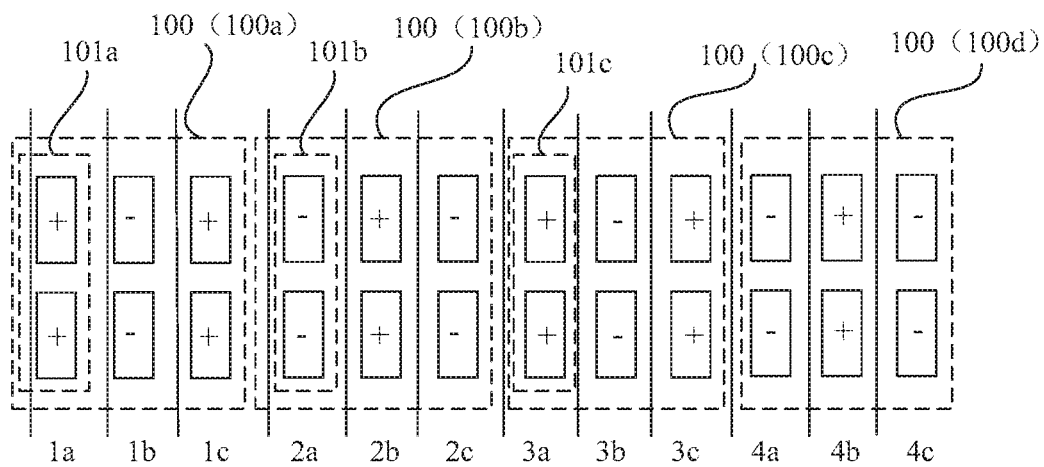
FIG. 10 is a partial schematic diagram of an array substrate according to an embodiment of the present disclosure.

As shown in FIG. 10, which is a partial schematic diagram of the array substrate shown in FIG. 9, the sub-pixels in the display area form multiple pixel unit columns 100 arranged in the same manner. In FIG. 10, four pixel unit columns are taken as an example. The four pixel unit columns include a pixel unit column 100*a*, a pixel unit column 100*b*, a pixel unit column 100*c* and a pixel unit column 100*d*. In the embodiment, it is assumed that each pixel unit column includes p sub-pixel unit columns, where p is a positive integer greater than or equal to 2. In FIG. 10, p=3, that is, a case that each pixel unit column includes three sub-pixel unit columns is described as an example. For example, each pixel unit column 100*a* includes three sub-pixel unit columns 101*a*.

In the embodiment, polarities of data signals in the same row in the sub-data lines corresponding to any two adjacent sub-pixel unit columns arranged in the same pixel unit column may be set to be opposite. For example, in the pixel unit column 100*a*, in a case that a data signal with positive polarity is received in the sub-pixel unit column 101*a* electrically connected to the sub-data line 1a, a data signal with negative polarity is received in the sub-pixel unit column electrically connected to the sub-data line 1b, and a data signal with positive polarity is received in the sub-pixel unit column electrically connected to the sub-data line 1c. In the pixel unit column 100*c*, in a case that a data signal with positive polarity is received in the sub-pixel unit column electrically connected to the sub-data line 3a, a data signal with negative polarity is received in the sub-pixel unit column electrically connected to the sub-data line 3b, and a data signal with positive polarity is received in the sub-pixel unit column electrically connected to the sub-data line 3c.

Moreover, in the embodiment, polarities of data signals in the same row in the sub-data lines corresponding to the two adjacent sub-pixel unit columns respectively arranged in adjacent pixel unit columns are set to be opposite. That is, in FIG. 10, the pixel unit column 100*a* is adjacent to the pixel unit column 100*b*, the pixel unit column 100*b* is adjacent to the pixel unit column 100*c*, and the pixel unit column 100*c* is adjacent to the pixel unit column 100*d*. Then, in the embodiment, in a case that a data signal with positive polarity is received in the sub-pixel unit column 101*a* electrically connected to the sub-data line 1c, a data signal with negative polarity is received in the sub-pixel unit column 101*b* electrically connected to the sub-data line 2a. In a case that a data signal with negative polarity is received in the sub-pixel unit column 101*b* electrically connected to the sub-data line 2c, a data signal to with positive polarity is received in the sub-pixel unit column 101*c* electrically connected to the sub-data line 3a, and so forth, and which is not be described repeatedly.

Figure 11:
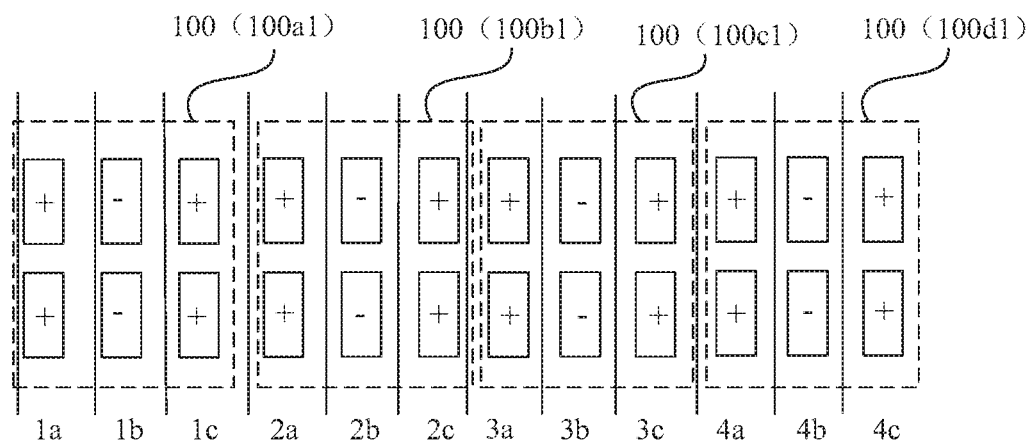
FIG. 11 is another partial schematic diagram of an array substrate according to an embodiment of the present disclosure.

In addition, as shown in FIG. 11, in the embodiment, polarities of data signals in the same row of the sub-data lines corresponding to any two adjacent sub-pixel unit columns arranged in the same pixel unit column may set to be opposite, and polarities of data signals in the same row of the sub-data lines corresponding to two adjacent sub-pixel unit columns respectively arranged in adjacent pixel unit columns may set to be the same.

For example, in FIG. 11, the pixel unit column 100*a*1 is adjacent to the pixel unit column 100*b*1, the pixel unit column 100*b*1 is adjacent to the pixel unit column 100*c*1, and the pixel unit column 100*c*1 is adjacent to the pixel unit column 100*d*1. In the embodiment, in a case that a data signal with positive polarity is received in the sub-pixel unit column electrically connected to the sub-data line 1c, a data signal with positive polarity is also received in the sub-pixel unit column electrically connected to the sub-data line 2a.

In the embodiment, if polarities of the data signals received by the sub-pixels in the display area may be distributed in any one manner, at least two data lead lines for receiving data signals with the same polarity among the data lead lines in the wiring area included in the multiple sub-data lines corresponding to the same clock signal line are arranged to overlap in this embodiment.

As compared with the above embodiment in which polarities of data signals received in the overlapping data lead lines are different, coupling capacitance between the overlapping data lead lines is further reduced in this embodiment since the data signals received in the overlapping data lead lines have the same polarity.

It is assumed that the polarities of the data signals received in the overlapping data lead lines are different in the above embodiment. For example, for two overlapping data lead lines, a data signal received in one data lead line have a magnitude of +5V, and a data signal received in the other data lead line has a magnitude of −5V. In this case, a voltage difference exists between the two data lead lines, which results in coupling capacitance. However, it should be illustrated that since data signals are inputted into the two overlapping data lead lines simultaneously, signal transition in one data lead line of two data lead lines does not pull up or pull down a data signal in the other data lead line.

In this embodiment, data signals received in the overlapping data lead lines have the to same polarity. That is, for two overlapping data lead lines, a data signal received by one data lead line has a magnitude of +5V, and a data signal received by the other data lead line also has a magnitude of +5V. Then, no voltage difference exists between the two data lead lines, which does not result in coupling capacitance.

Illustratively, referring to FIG. 9, among the data lead lines included in the multiple sub-data lines corresponding to the same clock signal line CKHa, the sub-data line 1a is adjacent to the sub-data line 2a, the sub-data line 2a is adjacent to the sub-data line 3a, and the sub-data line 3a is adjacent to the sub-data line 4a. Also, polarity of a data signal transmitted in the sub-data line 1a is +, polarity of a data signal transmitted in the sub-data line 2a is −, polarity of a data signal transmitted in the sub-data line 3a is +, and polarity of a data signal transmitted in the sub-data line 4a is −. In this embodiment, the data lead line included in the sub-data line 1a is arranged to overlap the data lead line included in the sub-data line 3a, the data lead line included in the sub-data line 1b is arranged to overlap the data lead line included in the sub-data line 3b, the data lead line included in the sub-data line 1c is arranged to overlap the data lead line included in the sub-data line 3c, the data lead line included in the sub-data line 2a is arranged to overlap the data lead line included in the sub-data line 4a, the data lead line included in the sub-data line 2b is arranged to overlap the data lead line included in the sub-data line 4b, and the data lead line included in the sub-data line 2c is arranged to overlap the data lead line included in the sub-data line 4c.

Referring to FIG. 6, a laminated relationship of the array substrate according to this embodiment is described as follows with taking the data lead lines overlapping in two layers as an example.

In the wiring area, among the data lead lines included in the multiple sub-data lines corresponding to the same clock signal line, the data lead lines having at least partially overlapping orthographic projections on the array substrate at least include a first data lead line and a second data lead line. For example, in a case that the first data lead line is a lead line 11a, the second data lead line is a lead line 12a. In a case that the first data lead line is a lead line 1b, the second data lead line is a lead line 12b. In a case that the first data lead line is a lead line 11c, the second data lead line is a lead line 12c.

At least two adjacent sub-data lines of the multiple sub-data lines corresponding to the same clock signal line includes a first sub-data line and a second sub-data line. For example, in a case that the first sub-data line is the sub-data line 1a, the second sub-data line is the sub-data line 2a. In a case that the first sub-data line is the sub-data line 1 b, the second sub-data line is the sub-data line 2b. In a case that the first sub-data line is the sub-data line 1c, the second sub-data line is the sub-data line 2c.

The first data lead line is connected to the first sub-data line, and the second data lead line is connected to the second sub-data line. That is, the first data lead line 11a is connected to the first sub-data line 1a, and the first data lead line 11b is connected to the first sub-data line 1b, the first data lead line 11c is connected to the first sub-data line 1c, the second data lead line 12a is connected to the second sub-data line 2a, the second data lead line 12b is connected to the second sub-data line 2b, and the second data lead line 12c is connected to the second sub-data line 2c.

The array substrate may include a first metal layer M1 and a second metal layer M2. The first metal layer M1 and the second metal layer M2 are insulated from each other. The first metal layer is arranged on a side of the substrate, and the second metal layer is arranged on a side of the first metal layer away from the substrate.

In this embodiment, the first sub-data line (for example, the first sub-data line 1a, the first sub-data line 1b, and the first sub-data line 1c) and the second sub-data line (for example, the second sub-data line 2a, the second sub-data line 2b, and the second sub-data line 2c) are both arranged in the second metal layer M2. In the wiring area, the first data lead line (for example, the first data lead line 11a, the first data lead line 11b, and the first data lead line 11c) are arranged in the first metal layer M1, and the second data lead line (for example, the second data lead line 12a, the second data lead line 12b, and the second data lead line 12c) are arranged in the second metal layer M2.

Since the first data lead line (for example, the first data lead line 11a, the first data lead line 11b, and the first data lead line 11c) and the first sub-data line (for example, the first sub-data line 1a, the first sub-data line 1b, and the first sub-data line 1c) are arranged in different metal layers, the first sub-data line (the first sub-data line 1a, the first sub-data line 1b, and the first sub-data line 1c) is connected to the first data lead line (for example, the first data lead line 11a, the first data lead line 11b, and the first data lead line 11c) corresponding to the first sub-data line through a first via hole.

Figure 7:
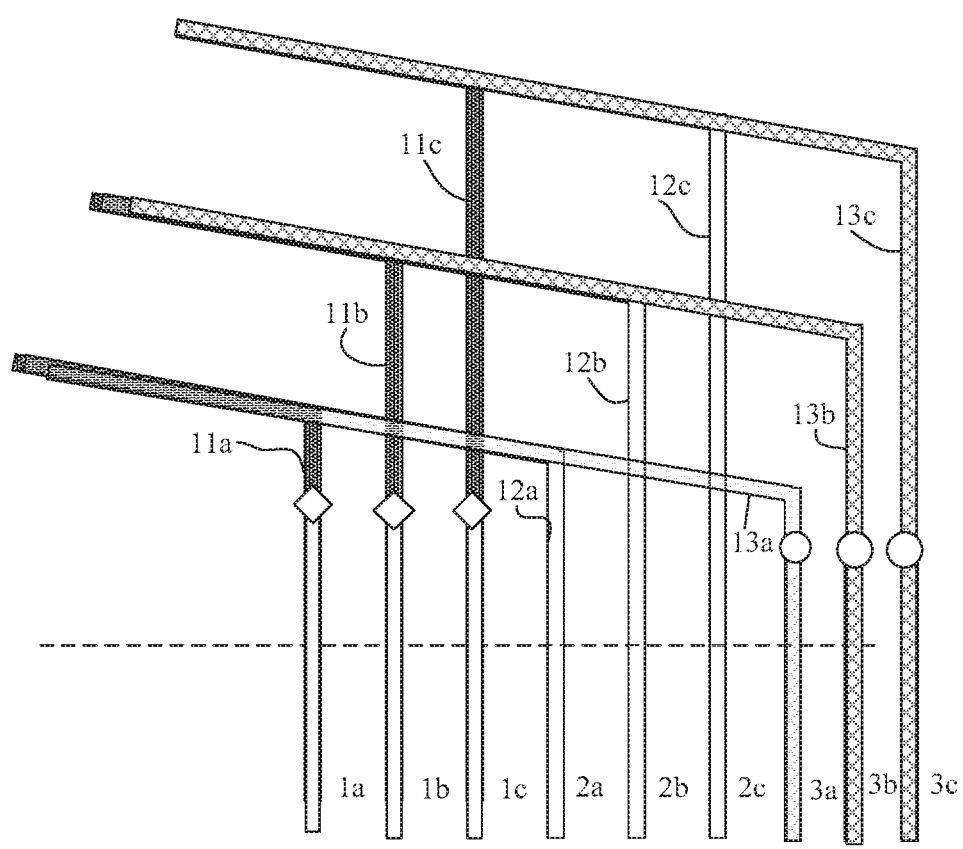
FIG. 7 is a diagram showing a laminated relation of a part of data lead lines in the wiring area of an array substrate according to an embodiment of the present disclosure.

Also referring to FIG. 7, the laminated relation of the array substrate according to this embodiment is described as follows with taking the data lead lines overlapping in three layers as an example.

In the wiring area, among the data lead lines included in the multiple sub-data lines corresponding to the same clock signal line, the data lead lines having at least partially overlapping orthographic projections on the array substrate include a first data lead line, a second data lead line and a third data lead line. For example, in a case that the first data lead line is the lead line 11a, the second data lead line is the lead line 12a, and the third data lead line is the lead line 13a. In a case that the first data lead line is the lead line 11b, the second data lead line is the lead line 12b, and the third data lead line is the lead line 13b. In a case that the first data lead line is the lead line 11c, the second data lead line is the lead line 12c, and the third data lead line is the lead line 13c.

At least three adjacent sub-data lines of the multiple sub-data lines corresponding to the same clock signal line include a first sub-data line, a second sub-data line and a third sub-data line. For example, in a case that the first sub-data line is the sub-data line 1a, the second sub-data line is the sub-data line 2a, and the third sub-data line is the sub-data line 3a. In a case that the first sub-data line is the sub-data line 1b, the second sub-data line is the sub-data line 2b, and the third sub-data line is the sub-data line 3b. In a case that the first sub-data line is the sub-data line 1c, the second sub-data line is the sub-data line 2c, and the third sub-data line is the sub-data line 3c.

The first data lead line is connected to the first sub-data line, the second data lead line is connected to the second sub-data line, and the third data lead line is connected to the third sub-data line. That is, the first data lead line 11a is connected to the first sub-data line 1a, and the first data lead line 11b is connected to the first sub-data line 1b, the first data lead line 11c is connected to the first sub-data line 1c. The second data lead line 12a is connected to the second sub-data line 2a, the second data lead line 12b is connected to the second sub-data line 2b, and the second data lead line 12c is connected to the second sub-data line 2c. The third data lead line 13a is connected to the third sub-data line 3a, the third data lead line 13b is connected to the third sub-data line 3b, and the third data lead line 13c is connected to the third sub-data line 3c.

The array substrate may include a third metal layer M1, a fourth metal layer M2, and a fifth metal layer M3. The third metal layer M1, the fourth metal layer M2 and the fifth metal layer M3 are insulated from each other. The third metal layer M1 is arranged on a side of the substrate, the fourth metal layer M2 is arranged on a side of the third metal layer M1 away from the substrate, and the fifth metal layer M3 is arranged on a side of the fourth metal layer M2 away from the substrate.

In this embodiment, the first sub-data line and the second sub-data line are both arranged in the fourth metal layer M2. In the wiring area, a part of the data lead lines are arranged in the third metal layer M1, and a part of the data lead lines are arranged in the fifth metal layer M3.

Since the first data lead line and the first sub-data line are arranged in different metal layers, the first sub-data line is electrically connected to the first data lead line corresponding to the first sub-data line through a second via hole. Since the third data lead line and the third sub-data line are arranged in different metal layers, the third sub-data line is electrically connected to the third data lead line corresponding to the third sub-data line through a third via hole.

It should be illustrated that the third metal layer M1 may be a metal layer in which the gate lines are arranged, and the fourth metal layer M2 and the fifth metal layer M3 may be a metal layer in which data lines are arranged. In addition, In one embodiment, the gate lines may be arranged in the third metal layer M1, the data lines may be arranged in the fourth metal layer M2, and the touch wiring may be arranged the fifth metal layer M3.

On the basis of the above embodiments, in the array substrate according to the embodiment, the sub-pixels form pixel unit columns, and the pixel unit columns may also be separated into multiple pixel units. Each of the pixel units may include sub-pixels with three colors including a red sub-pixel, a green sub-pixel and a blue sub-pixel, and may also include sub-pixels with four colors including for example a red sub-pixel, a green sub-pixel, a blue sub-pixel, and a white sub-pixel.

Figure 12:
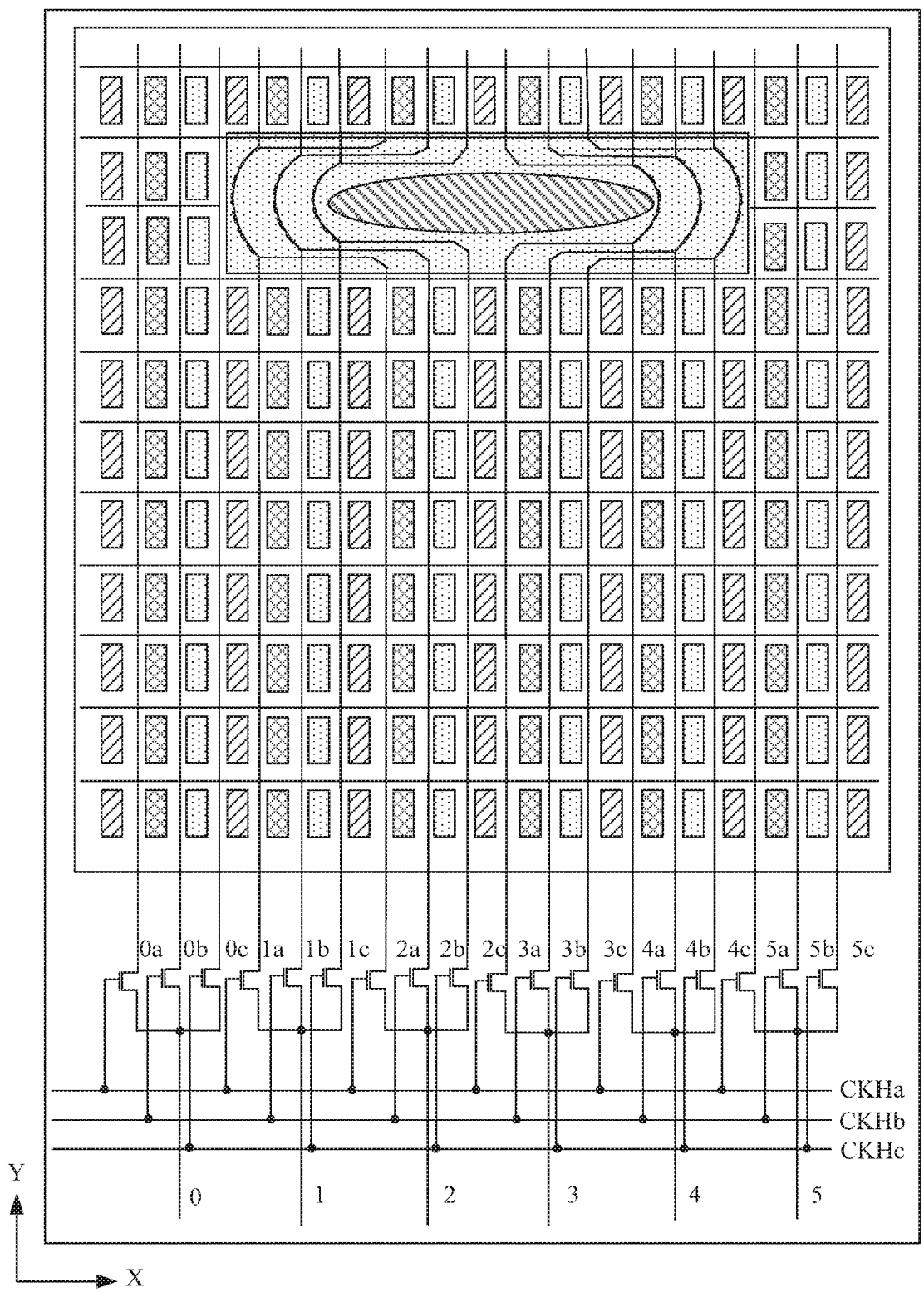
FIG. 12 is another schematic structural diagram of an array substrate according to an embodiment of the present disclosure.

In addition, in this embodiment, the sub-pixels may be arranged in multiple manners. As shown in FIG. 12, which is another schematic structural diagram of an array substrate according to the embodiment of the present disclosure, all of the sub-pixels in each sub-pixel column have the same color, and the sub-pixels in two adjacent sub-pixel columns have different colors.

Figure 13:
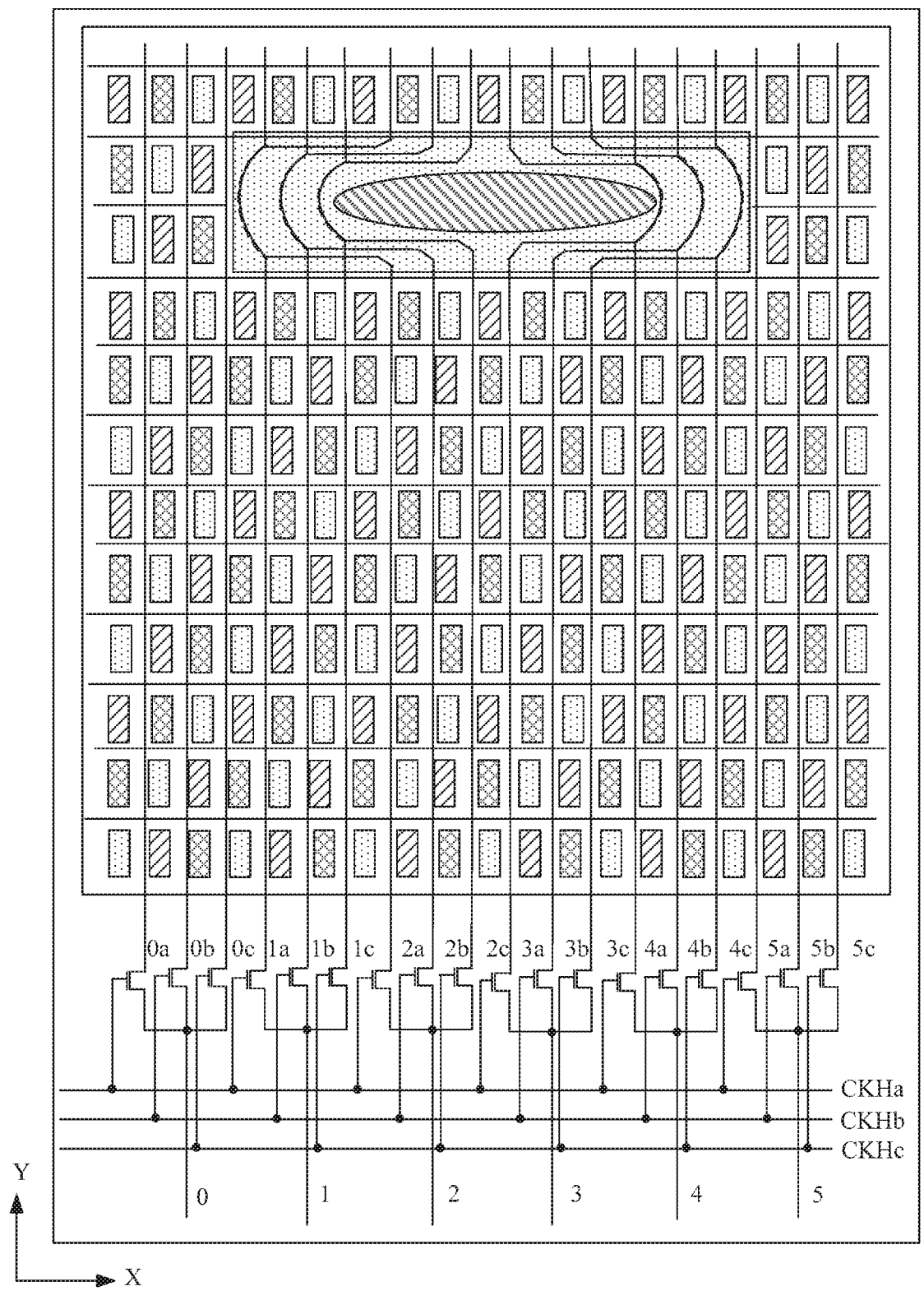
FIG. 13 is another schematic structural diagram of an array substrate according to an embodiment of the present disclosure.

In addition, the sub-pixels may also be arranged as shown in FIG. 13. FIG. 13 is another schematic structural diagram of an array substrate according to an embodiment of the present disclosure. Each sub-pixel column includes k sub-pixels, and each sub-pixel column has j colors, where j≤k. The sub-pixels in the same row which are respectively arranged in two adjacent sub-pixel columns have different colors.

The red sub-pixel, the green sub-pixel, the blue sub-pixel and the white sub-pixel are sequentially arranged along a row direction of the pixel unit column. The adjacent sub-pixels in each sub-pixel column have different colors.

It should be noted that there may be multiple arrangement manners to make the colors of the sub-pixels in the same column different from each other. For example, the red sub-pixel, the blue sub-pixel, the green sub-pixel and the white sub-pixel are sequentially arranged along a column direction of the pixel unit column. In one embodiment, the red sub-pixel, the green sub-pixel, the blue sub-pixel and the white sub-pixel are sequentially arranged along the column direction of the pixel unit column. In practice, there may be other arrangement manner to make the colors of the adjacent sub-pixels in each column different from each other.

Figure 14:
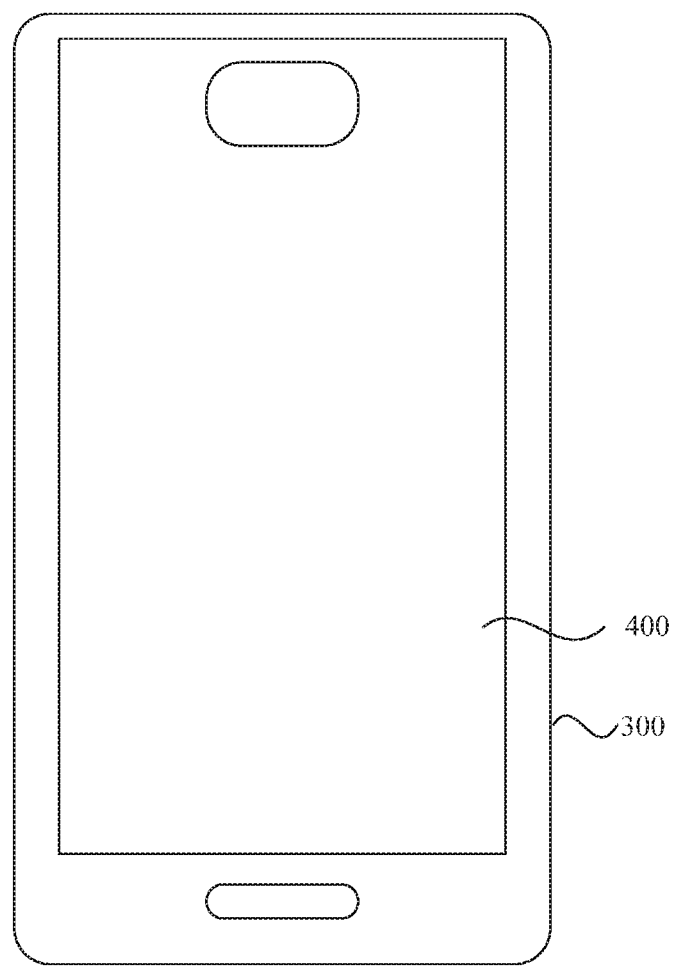
FIG. 14 is a schematic structural diagram of a display panel according to an embodiment of the present disclosure.

Based on the same inventive concept, a display panel is further provided according to an embodiment of the present disclosure. FIG. 14 is a schematic structural diagram of a display panel according to an embodiment of the present disclosure. Referring to FIG. 14, the display panel 300 includes any one of the array substrates 400 according to the embodiments of the present disclosure. The display panel 300 may be applied to an electronic device such as a mobile phone, a tablet computer, and a smart wearable device.

Since the display panel 300 according to the embodiment of the present disclosure includes any one of the array substrates 400 according to the embodiments of the present disclosure, the display panel 300 has the beneficial effects of the array substrate 400 included therein, which are not described herein again.

To sum up, an array substrate is provided in the present disclosure, which includes a substrate, multiple gate lines and multiple sub-data lines, and m data lines and n clock signal lines. The substrate includes a non-display area and a display area. The non-display area includes a first non-display area and a second non-display area, and the display area includes a normal display area and a wiring area. The normal display area is surrounded by the first non-display area, the wiring area is surrounded by the normal display area, and the second non-display area is surrounded by the wiring area. The second non-display area includes an opening area. The multiple gate lines and the multiple sub-data lines are arranged in the display area, and the multiple gate lines intersect with the multiple sub-data lines to define multiple sub-pixels. The sub-pixels arranged in the same column are electrically connected to a same sub-data line. The m data lines and the n clock signal lines are arranged in the first non-display area. Each of the data lines corresponds to n sub-data lines, and the n sub-data lines corresponding to the same data line have a one-to-one correspondence with n charging switches. The n clock signal lines respectively control the n charging switches to be turned on, to transmit data signals in the data lines to the sub-data lines corresponding to the data lines. The sub-data line passing through the wiring area includes a first sub-data line, a second sub-data line and a data lead line. The first sub-data line and the second sub-data line are arranged in the display area, and the data lead line is arranged in the wiring area. For the same sub-data line, the first sub-data line and the second sub-data line are connected by the data lead line. In the wiring area, among the data lead lines included in the multiple sub-data lines corresponding to the same clock signal line, at least two data lead lines have at least partially overlapping orthographic projections on the array substrate.

It can be seen that in the solution, the data lead lines corresponding to the sub-pixels charged simultaneously are arranged to overlap, to reduce the number of data lead lines arranged in the same layer of the wiring area, and decrease the area of the wiring area, thereby realizing the design of a narrow bezel between the second non-display area and the normal display area. Moreover, since the number of data lead lines in the same layer of the wiring area is reduced, a line distance between adjacent data lead lines is increased, thereby reducing coupling capacitance between the adjacent data lead lines arranged in the same layer.

In addition, since data signals are inputted into the overlapping data lead lines simultaneously, signal transition in one data lead line has less impact on the signal in another data lead line, that is, signal interference between the multiple data lead lines is reduced.

The invention claimed is:

1. An array substrate, comprising:
   a substrate comprising a non-display area and a display area, wherein the non-display area comprises a first non-display area and a second non-display area, and the display area comprises a normal display area and a wiring area, wherein the normal display area is surrounded by the first non-display area, the wiring area is surrounded by the normal display area, the second non-display area is surrounded by the wiring area, and the second non-display area comprises an opening area;

a plurality of gate lines and a plurality of sub-data lines arranged in the display area, wherein the plurality of gate lines intersect with the plurality of sub-data lines to define a plurality of sub-pixels, and the sub-pixels arranged in a same column are electrically connected to a same sub-data line; and m data lines and n clock signal lines arranged in the first non-display area, wherein each of the m data lines corresponds to n sub-data lines of the plurality of sub-data lines, and the n sub-data lines corresponding to a same data line have a one-to-one correspondence with n charging switches, and the n clock signal lines respectively control the n charging switches to be turned on, to transmit data signals in the data lines to the sub-data lines corresponding to the data lines, m is a positive integer, and n is a positive integer greater than or equal to 2, wherein the sub-data line passing through the wiring area comprises a first sub-data line, a second sub-data line and a data lead line, with the first sub-data line and the second sub-data line being arranged in the display area, the data lead line being arranged in the wiring area, for a same sub-data line, the first sub-data line and the second sub-data line are connected by the data lead line, and in the wiring area, among the data lead lines comprised in the sub-data lines corresponding to a same clock signal line, at least two data lead lines have at least partially overlapping orthographic projections on the array substrate.

2. The array substrate according to claim 1, wherein in the wiring area, among the data lead lines comprised in the sub-data lines corresponding to the same clock signal line, data signals received in the data lead lines having the at least partially overlapping orthographic projections on the array substrate have a same polarity.

3. The array substrate according to claim 1, wherein in the wiring area, among the data lead lines comprised in the sub-data lines corresponding to the same clock signal line, the data lead lines having the at least partially overlapping orthographic projections on the array substrate comprise at least a first data lead line and a second data lead line;

at least two adjacent sub-data lines among the sub-data lines corresponding to the same clock signal line comprise a first sub-data line and a second sub-data line; and the first data lead line is connected to the first sub-data line, and the second data lead line is connected to the second sub-data line.

4. The array substrate according to claim 3, wherein in the wiring area, among the data lead lines comprised in the sub-data lines corresponding to the same clock signal line, the data lead lines having the at least partially overlapping orthographic projections on the array substrate further comprise a third data lead line;

at least three adjacent sub-data lines among the sub-data lines corresponding to the same clock signal line comprise the first sub-data line, the second sub-data line, and a third sub-data line; and the first data lead line is connected to the first sub-data line, the second data lead line is connected to the second sub-data line, and the third data lead line is connected to the third sub-data line.

5. The array substrate according to claim 3, comprising:

a first metal layer arranged on a side of the substrate; and a second metal layer arranged on a side of the first metal layer away from the substrate, wherein the first metal layer and the second metal layer are insulated from each other;

the first sub-data line and the second sub-data line are arranged on the first metal layer; and in the wiring area, the first data lead line is arranged in the first metal layer, and the second data lead line is arranged in the second metal layer.

6. The array substrate according to claim 5, wherein the second sub-data line is electrically connected to the second data lead line through a first via hole.

7. The array substrate according to claim 4, comprising:

a third metal layer arranged on a side of the substrate;

a fourth metal layer arranged on a side of the third metal layer away from the substrate; and a fifth metal layer arranged on a side of the fourth metal layer away from the substrate, wherein the third metal layer, the fourth metal layer and the fifth metal layer are insulated from each other, the first sub-data line, the second sub-data line and the third sub-data line are arranged in the fourth metal layer, and in the wiring area, the first data lead line is arranged in the third metal layer, the second data lead line is arranged in the fourth metal layer, and the third data lead line is arranged in the fifth metal layer.

8. The array substrate according to claim 7, wherein the first sub-data line is electrically connected to the first data lead line through a second via hole; and the third sub-data line is electrically connected to the third data lead line through a third via hole.

9. The array substrate according to claim 1, wherein the plurality of sub-pixels form pixel units, and each of the pixel units comprises a red sub-pixel, a green sub-pixel and a blue sub-pixel.

10. The array substrate according to claim 9, wherein each of the pixel units further comprises a white sub-pixel.

11. The array substrate according to claim 1, wherein data signals in the sub-data lines corresponding to any two adjacent sub-pixels of the sub-pixels arranged in a same row have different polarities.

12. The array substrate according to claim 1, wherein the plurality of sub-pixels form a plurality of pixel unit columns, and each of the pixel unit columns comprise p sub-pixel unit columns, wherein p is a positive integer greater than or equal to 2;

data signals in a same row in the sub-data lines corresponding to any two adjacent sub-pixel unit columns arranged in a same pixel unit column of the plurality of pixel unit columns have different polarities; and data signals in a same row in the sub-data lines corresponding to two adjacent sub-pixel unit columns respectively arranged in two adjacent pixel unit columns of the plurality of pixel unit columns have different polarities.

13. The array substrate according to claim 1, wherein
the plurality of sub-pixels form a plurality of pixel unit columns, and each of the pixel unit columns comprise p sub-pixel unit columns, wherein p is a positive integer greater than or equal to 2;
data signals in a same row in the sub-data lines corresponding to any two adjacent sub-pixel unit columns arranged in a same pixel unit column of the plurality of pixel unit columns have different polarities;
data signals in a same row in the sub-data lines corresponding to two adjacent sub-pixel unit columns respectively arranged in two adjacent pixel unit columns of the plurality of pixel unit columns have a same polarity.

14. The array substrate according to claim 1,
wherein the sub-pixels in a same column have the same color, and the sub-pixels in two adjacent columns have different colors.

15. The array substrate according to claim 1,
wherein k sub-pixels are arranged in each column, and the k sub-pixels in a same column have j colors, and j≤k;
the sub-pixels in a same row which are respectively arranged in two adjacent columns have different colors.

16. The array substrate according to claim 10, wherein
the red sub-pixel, the green sub-pixel, the blue sub-pixel and the white sub-pixel are sequentially arranged along a row direction of each of the pixel units; and
the adjacent sub-pixels in each column have different colors.

17. The array substrate according to claim 16, wherein
the red sub-pixel, the blue sub-pixel, the green sub-pixel and the white sub-pixel are sequentially arranged along a column direction of each of the pixel units.

18. A display panel, comprising:
an array substrate, wherein the array substrate comprises:
a substrate comprising a non-display area and a display area, with the non-display area comprising a first non-display area and a second non-display area, and the display area comprising a normal display area and a wiring area, wherein the normal display area is surrounded by the first non-display area, the wiring area is surrounded by the normal display area, the second non-display area is surrounded by the wiring area, and the second non-display area comprises an opening area;
a plurality of gate lines and a plurality of sub-data lines arranged in the display area, wherein the plurality of gate lines intersect with the plurality of sub-data lines to define a plurality of sub-pixels, and the sub-pixels arranged in a same column are electrically connected to a same sub-data line; and
m data lines and n clock signal lines arranged in the first non-display area, wherein each of the m data lines corresponds to n sub-data lines of the plurality of sub-data lines, and the n the sub-data lines corresponding to a same data line have a one-to-one correspondence with n charging switches, and the n clock signal lines respectively control the n charging switches to be turned on, to transmit data signals in the data lines to the sub-data lines corresponding to the data lines, m is a positive integer, and n is a positive integer greater than or equal to 2, wherein
the sub-data line passing through the wiring area comprises a first sub-data line, a second sub-data line and a data lead line, with the first sub-data line and the second sub-data line being arranged in the display area, the data lead line being arranged in the wiring area,
for a same sub-data line, the first sub-data line and the second sub-data line are connected by the data lead line, and
in the wiring area, among the data lead lines comprised in the sub-data lines corresponding to a same clock signal line, at least two data lead lines have at least partially overlapping orthographic projections on the array substrate.

* * * * *